(12) United States Patent
Nguyen

(10) Patent No.: US 10,533,703 B1
(45) Date of Patent: Jan. 14, 2020

(54) MOUNTING SYSTEM FOR TOOL-LESS ATTACHMENT OF ELECTRONIC DEVICE TO A RAIL

(71) Applicant: Hewlett Packard Enterprise Development LP, Houston, TX (US)

(72) Inventor: Tri Luong Nguyen, Santa Clara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/125,194

(22) Filed: Sep. 7, 2018

(51) Int. Cl.
*F16M 13/02* (2006.01)
*H05K 5/02* (2006.01)

(52) U.S. Cl.
CPC ......... *F16M 13/027* (2013.01); *H05K 5/0204* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,191,352 A * | 3/1980 | Schuplin | ................. | E04B 9/006 248/317 |
| 4,422,609 A * | 12/1983 | Clark | ................... | F16B 5/0642 248/228.1 |
| 5,467,954 A * | 11/1995 | Wekell | ................. | A47B 95/008 248/201 |
| 6,371,424 B1 * | 4/2002 | Shaw | ................... | F16M 11/041 248/187.1 |
| 6,976,662 B2 * | 12/2005 | Kump | ..................... | E04B 9/006 248/222.52 |
| 7,156,674 B1 | 1/2007 | Frank | | |
| 8,235,349 B1 * | 8/2012 | Conklin | .............. | F16M 13/027 109/50 |
| 9,303,811 B1 * | 4/2016 | Lutz, Jr. | ................ | F16M 13/02 |

(Continued)

OTHER PUBLICATIONS

Cisco Systems, Inc., "Access Point Mounting Instructions," Nov. 5, 2010, pp. 1-15 (online), Retrieved from the Internet on Jul. 13, 2018 at URL: <cisco.com/c/en/us/td/docs/wireless/access_point/mounting/guide/apmount.html>.

(Continued)

*Primary Examiner* — Monica E Millner
(74) *Attorney, Agent, or Firm* — Hewlett Packard Enterprise Patent Department

(57) ABSTRACT

An example mounting system for attaching an electronic device, such as a wireless access point, to a structure, such as a drop ceiling rail. The mounting system includes a bracket assembly and a device brace. The bracket assembly includes a first bracket and a second bracket that are separate from one another, each including a bottom flange and a top flange that forms a groove, the first bracket including a retention clip. The device brace is attachable to the electronic device and includes two grooves. The mounting system is tool-lessly attachable to the rail by: sliding the grooves of the first and second brackets onto flanges of the rail, sliding the second bracket into engagement with the retention clip such that the retention clip holds the first and second brackets together on the rail, and sliding the grooves of the device brace onto the bottom flanges of the first and second brackets such that the bracket assembly supports the device brace.

20 Claims, 7 Drawing Sheets

(56) References Cited

U.S. PATENT DOCUMENTS

| | | | |
|---|---|---|---|
| 9,714,529 B1* | 7/2017 | Conklin | E05B 73/0082 |
| 9,769,940 B1 | 9/2017 | Gonzalez et al. | |
| 9,955,597 B1* | 4/2018 | Wu | F16M 13/02 |
| 10,161,565 B2* | 12/2018 | Wu | F16F 1/12 |
| 2006/0022107 A1 | 2/2006 | Lim et al. | |
| 2010/0314522 A1* | 12/2010 | Molnar | H02B 1/052 |
| | | | 248/346.06 |
| 2012/0049024 A1* | 3/2012 | Smith | F16M 11/041 |
| | | | 248/222.14 |
| 2014/0117186 A1 | 5/2014 | Govindasamy et al. | |
| 2018/0092239 A1* | 3/2018 | Terao | F16M 11/048 |
| 2018/0098452 A1* | 4/2018 | Baker | H05K 7/1474 |
| 2018/0279492 A1* | 9/2018 | Svedberg | H04N 7/18 |
| 2018/0299064 A1* | 10/2018 | Hall | F16M 13/027 |

OTHER PUBLICATIONS

Cisco, "Access Point Physical Hardware and Mounting Options," Apr. 3, 2018, pp. 1-12 (online), Retrieved from the Internet on Jul. 13, 2018 at URL: <cisco.com/c/en/us/td/docs/wireless/controller/technotes/8-3/b_cisco_aironet_series_2800_3800_access_point_deployment_guide/b_cisco_aironet_series_2800_3800_access_point_deployment_guide_chapter_010.html>.

Juniper Networks, "Installing the WLA532 Access Point on a Suspended Ceiling Rail," Mar. 14, 2012, pp. 1-4 (online), Retrieved from the Internet on Jul. 13, 2018 at URL: <juniper.net/documentation/en_US/release-independent/wireless/topics/task/installation/wla532-ceiling-rail-install.html>.

\* cited by examiner

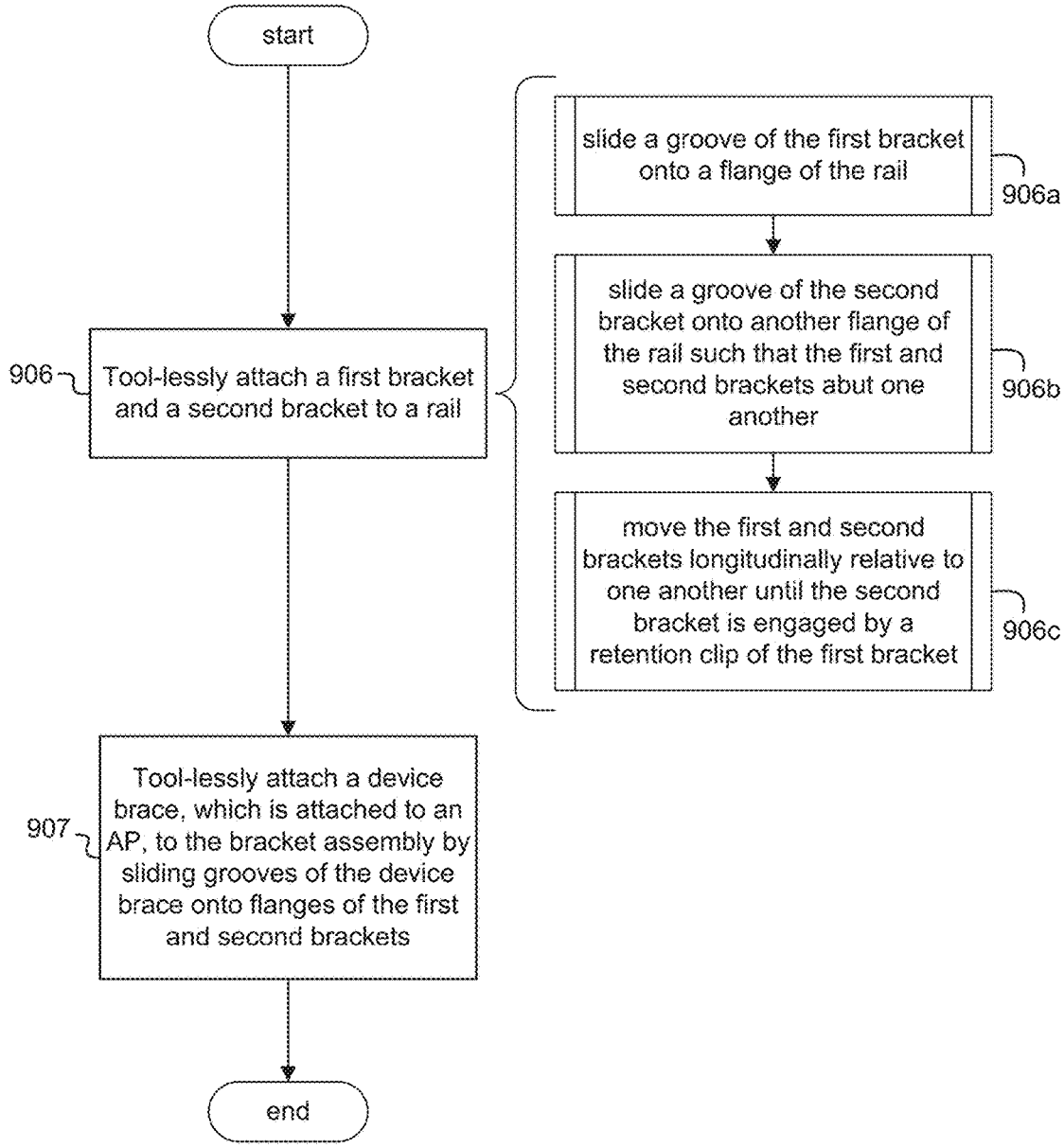

MOUNTING SYSTEM FOR TOOL-LESS ATTACHMENT OF ELECTRONIC DEVICE TO A RAIL

BACKGROUND

In some circumstances, it may be beneficial to mount an electronic device to a structure. For example, a wireless access point ("AP") may be mounted to the ceiling of a room. To enable such mounting of an electronic device to a structure, a mounting system (also referred to as a mounting bracket) may be used.

BRIEF DESCRIPTION OF THE DRAWINGS

FIG. 7 illustrates a process flow chart for another example method.

DETAILED DESCRIPTION

1. Introduction

Figure 1A:
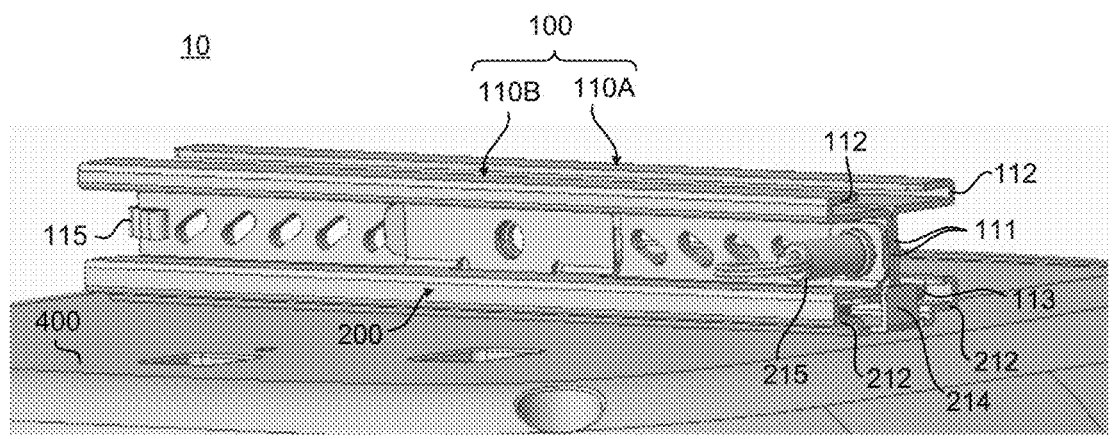
FIG. 1A illustrates a perspective view of an example mounting system in an installed state, with ceiling rail omitted for clarity.

The description below will focus on an AP as the electronic device to be mounted and a ceiling rail of a drop ceiling as the structure to be mounted to. However, this is just for ease of illustration, and it should be understood that the electronic device could be any electronic device (such as an internet-of-things edge device, a WLAN controller, etc.) and the ceiling rail could be any structural feature.

When mounting an AP to the ceiling, the person doing the mounting may need to attach various parts of the mounting system together and to the ceiling, while standing on a ladder, and often with just one hand being usable (since the other hand may be occupied holding other parts of the mounting system and/or the AP and/or tools and/or the ladder). This can often be very difficult for the person doing the mounting. The difficulty is often compounded by the fact that many mounting systems require mechanical fasteners to be installed to attach the parts of the mounting systems together and/or to the ceiling, and fastening such fasteners one-handed while on a ladder can be challenging and even unsafe. The same difficulties are encountered when attempting to un-mount the AP, for example in order to service it or move it to a new location.

Thus, example mounting systems disclosed herein are designed to make it easier to mount/un-mount the APs. For example, the example mounting systems may be configured to allow the AP to be mounted to the ceiling rail without using any tools or fastening any screws or other threaded fasteners. This simplifies the mounting process and saves time and effort. This also allows the person to carry, handle, and keep track of fewer items while on the ladder, which makes the process much easier and safer. As another example, the example mounting systems may be designed such that portions of the installation process may be performed using just one hand. This can be very helpful, since, as noted above, the person mounting the AP may have only one free hand at times.

More specifically, example mounting systems disclosed herein may include two main portions: a bracket assembly that is to attach to the ceiling rail, and a device brace that is attached to the AP and to the bracket assembly. These will be described in greater detail below.

The bracket assembly may include two separate brackets that include grooves that can be slid onto flanges of the ceiling rail. Thus, a person may easily and tool-lessly attach the bracket assembly to the ceiling rail by sliding each of the brackets onto opposite flanges of the rail, with the brackets arranged back-to-back. This may be done without needing any tools, and without having to use any fasteners (whether tightened by tool or by hand), thus greatly simplifying the mounting process. Furthermore, this attachment may be accomplished using one hand, which may be beneficial as the other hand of the person may be occupied holding other items (like the device brace and AP).

In addition, one of the brackets includes a retention clip that is capable of receiving a vertical wall of the other bracket when the brackets are positioned back-to-back and slid longitudinally relative to one another. The retention clip, when engaged, holds the two brackets together, and thus prevents them from detaching from the rail. Thus, after the person has attached the brackets to the rail, they may easily and tool-lessly secure the brackets to the rail by sliding the brackets longitudinally relative to one another until the retention clip engages the vertical wall of the other bracket. By securing the brackets together in this manner, the retention clip enables the person to let go of the brackets without having to worry about them falling off the rail. This may be beneficial as it may enable the person to focus their attention and hands on preparing to mount the device brace and AP without having to worry about holding the bracket assembly in place at the same time. Furthermore, this securing of the brackets together may be accomplished using one hand, without needing any tools, and without having to tighten any threaded fasteners, and therefore greatly simplifies the mounting process.

The device brace may be attached to the AP prior to starting the process of mounting the AP to the ceiling—for example, the device brace may be factory installed on the AP. The device brace may include two grooves that are to slidably receive respective flanges of the brackets. In other words, the device brace is tool-lessly attached to the bracket assembly by sliding the grooves of the device brace onto the flanges of the brackets. When so engaged, the ceiling rail vertically supports the brackets which vertically support the device brace which vertically supports the AP. The sliding of the device brace onto the brackets may be easily accomplished without needing any tools and without having to tighten any threaded fasteners, and therefore greatly simplifies the mounting process.

The device brace may also include a retention pin that can be tool-lessly actuated to engage a hole in the bracket assembly when the device brace has been slid along the bracket assembly into an installed position, thus preventing the device brace from being moving out of the installed position. For example, the retention pin may be a spring-loaded pin that can be easily actuated without needing any tool, for example by pulling and then releasing a ring.

In addition, once the device brace is engaged with the bracket assembly, the grooves of the device brace securely prevent the brackets from moving apart from one another, thus preventing the brackets from disengaging from the rail. Thus, the device brace secures the bracket assembly to the rail without using any threaded fasteners to fasten the brackets together, to the rail, or to the device brace. Although the retention clip also helps prevent the brackets from disengaging from the rail, it alone may be less secure than may be desired for holding the AP—for example, the retention clip may be designed to hold the brackets together without the AP attached, but might not be meant to hold the brackets together with the AP attached. Thus, the device brace supplements the retention clip to securely hold the brackets together even with the AP attached.

2. Example Mounting System

FIGS. 1-5 illustrate an example mounting system 10. Certain features of the mounting system 10 are visible in multiple of FIGS. 1-5. When one of the Figures may be particularly helpful or relevant to a feature being described, it will be called out, but it should be understood that the same feature may also be seen in others of the Figures that are not called out.

Figure 1B:
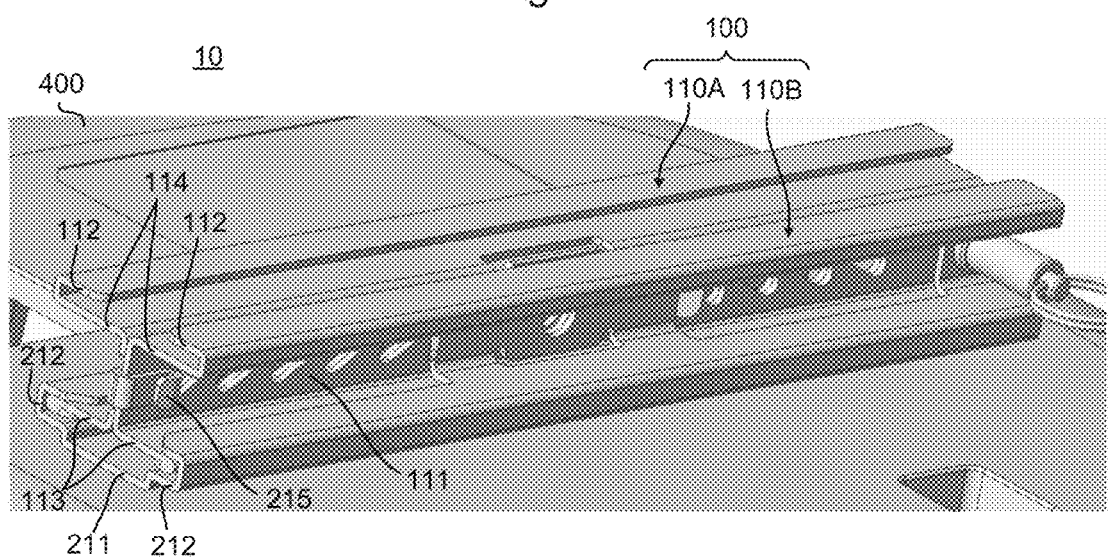
FIG. 1B illustrates another perspective view of the example mounting system in the installed state, with ceiling rail omitted for clarity.
Figure 2:
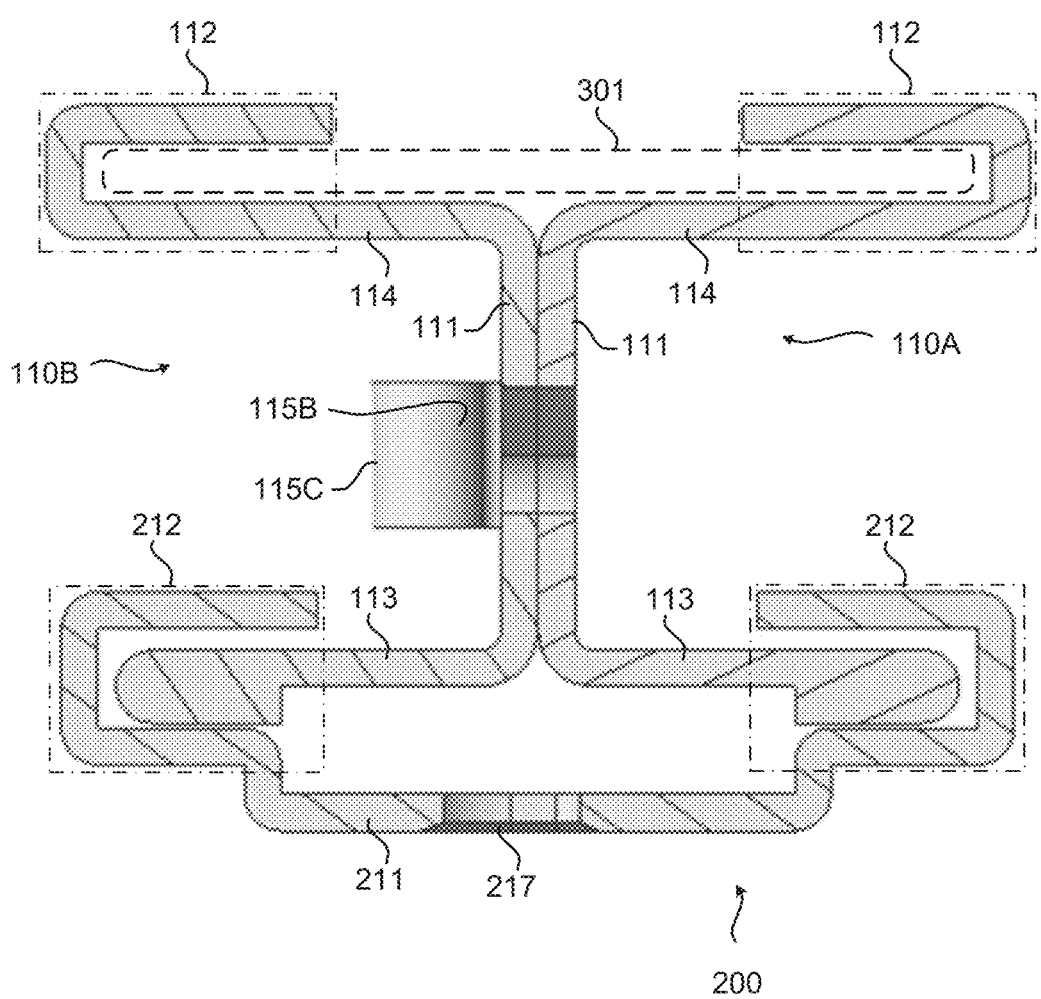
FIG. 2 illustrates a cross-sectional view of the example mounting system in the installed state.
Figure 3A:
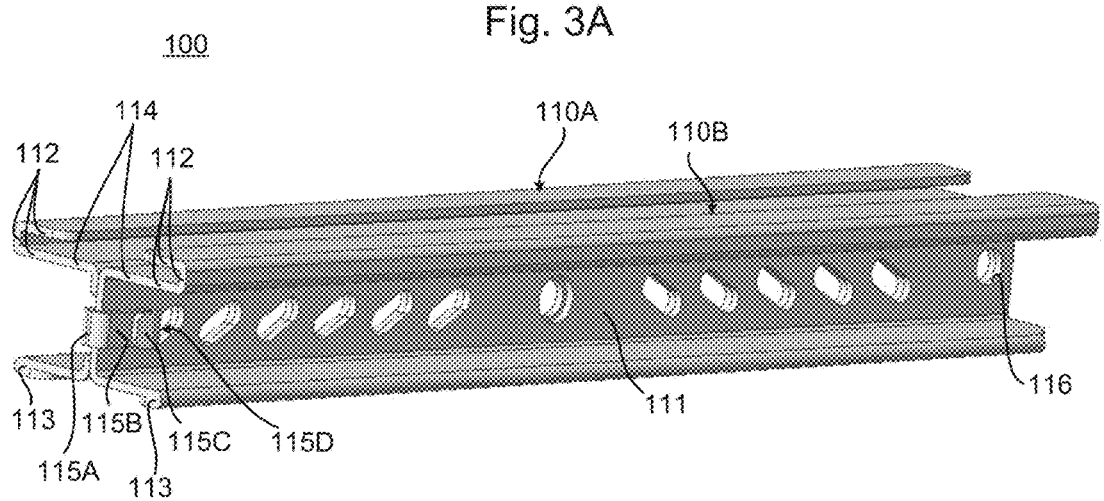
FIG. 3A illustrates a perspective view of an example bracket assembly with first and second brackets held together by a retention clip.
Figure 3B:
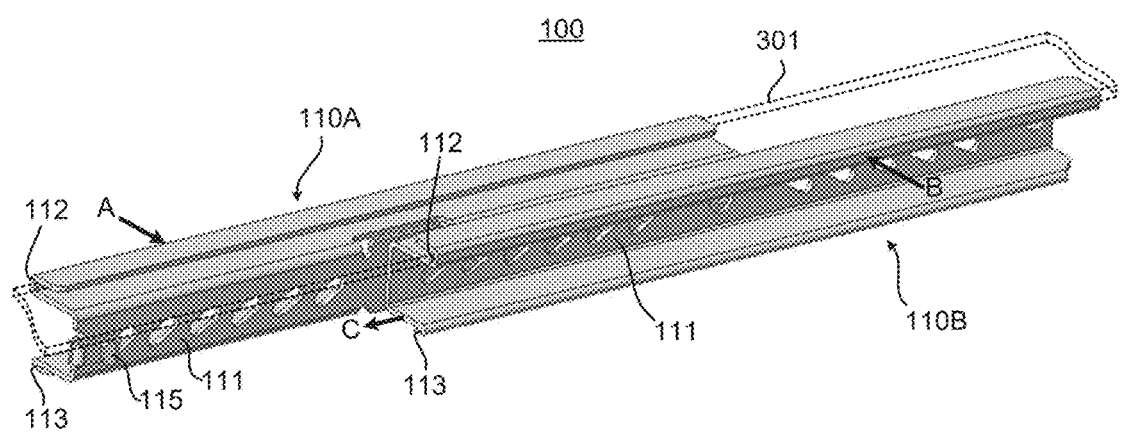
FIG. 3B illustrates a perspective view of the example bracket assembly with the second bracket assembly disengaged from the retention clip.

The mounting system 10 includes a bracket assembly 100 and a device brace 200 (see FIGS. 1-3). The bracket assembly 100 is to attach to a ceiling rail 300 (see FIG. 3A-3B). The device brace 200 is to attach to the AP 400 and to the bracket assembly 100 (see FIGS. 4 & 5). These components will be described in greater detail below.

2.1 Example Bracket Assembly

The bracket assembly 100 includes two separate brackets 110, specifically the first bracket 110A and the second bracket 110B (see FIGS. 2 & 3). The brackets 110 may have similar structures as one another, with the exception that, in some examples, the first bracket 110A may include a retention clip 115 while the second bracket 110B does not. Specifically, the brackets 110 each include a vertical wall 111, a top flange 114 extending horizontally from the top of the vertical wall 111 that forms a groove 112 at the end thereof, and a bottom flange 113 extending horizontally from the bottom of the vertical wall 11 (see FIGS. 2 & 3). Thus, the brackets 110 have a roughly U-shaped cross-section.

The groove 112 is a structure, formed at the distal end of the top flange 114, that defines a slot or channel running along a longitudinal dimension of the bracket 110 (see FIGS. 2 & 3). Specifically, the groove 112 has a roughly U-shaped (or C-shaped) cross-section, and includes a bottom groove wall that is roughly horizontal, a top groove wall that is roughly horizontal and located above the bottom groove wall, and an intermediate section that connects the top and bottom groove walls, (see FIGS. 2 & 3). The groove 112 is sized and shaped so as to receive a flange 301 of the ceiling rail 300 therein (see FIGS. 2 & 3). More specifically, the flange 301 slides into the groove 112 as the bracket 110 and the flange 301 move laterally relative to one another (such lateral movement is indicated by the arrows A and B in FIG. 3B, which are intended to show movement of the brackets 110 as they are slid onto the rail 300's flanges 301).

The first bracket 110A includes a retention clip 115 (see FIGS. 1-3). The retention clip 115 includes a portion extending roughly in parallel with the vertical wall 111, thereby defining a slot between the retention clip 115 and the vertical wall 111. The slot defined by the retention dip 115 is to slidably receive the vertical wall 111 of the second bracket 110B, thereby securing the first and second brackets 110A, 110B together. This state may be referred to herein as the retention clip 115 engaging the second bracket 110B, and is illustrated in FIGS. 1, 2, and 3A. When it is said that the retention clip secures the first and second brackets 110A, 110B together, this means that the retention clip 115 constrains translational motion of the first and second brackets 110A, 110B relative to one another along their horizontal lateral axes.

FIGS. 1-5 illustrate one possible example of how the retention clip 115 could be implemented. In this example, the retention clip includes a first portion 115A that extends from the vertical wall 111, a second portion 115B that extends from the first portion 115A, a third portion 115C that extends from the second portion 115B, and a fourth portion 115D that extends from the third portion 115C (see FIG. 3A). The first portion 115A includes one or more bends such that the second portion, which is approximately flat, is roughly parallel with the vertical wall 111 (see FIG. 3A). The second portion 115B and the vertical wall 111 define a slot between them, with a distance between the second portion 115B and the vertical wall 111 of the first bracket 110A being approximately equal to a thickness of the vertical wall 111 of the second bracket 110B. Thus, the vertical wall 111 of the second bracket 110B can be slidably received in the slot. The fourth portion 115D may provide a lip that a person may grasp to pull the retention clip outward, and is connected to the second portion by the third portion 115C via one or more bends (see FIGS. 2 & 3A). In some examples, the third and fourth portions 115C and 115D may be omitted.

The retention clip 115 may be configured to passively guide the second bracket 110B into the slot defined by the retention clip as the brackets 110 slide longitudinally relative to one another. This may be accomplished, for example, by having a section of the clip 115 that is sloped or curved towards the slot. This allows the sloped or curved section of the clip 115 to contact the vertical wall 111 of the second bracket 110B as it slides, and thereby passively guide the second bracket 110B into the slot. For example, the third portion 115C may include a sloped/curved section that is to contact and passively guide the vertical wall 111 of the second bracket 110B into the slot defined by the retention clip 115.

The brackets 110 may be made of a rigid material that is capable of holding its shape under the weight of the AP 400. For example, the brackets 110 may be made of a metal or metal alloy, such as steel, aluminum, zinc, brass, etc. As another example, the brackets 110 may be made from a rigid plastic, such as polyvinyl chloride (PCV). In some example, the brackets 110 may be formed by machining (e.g., bending, stamping, milling, etc.) a piece of sheet metal. In other examples, the brackets 110 may be cast, molded, injection molded, 3D printed, etc.

2.2 Example Device Brace

Figure 4:
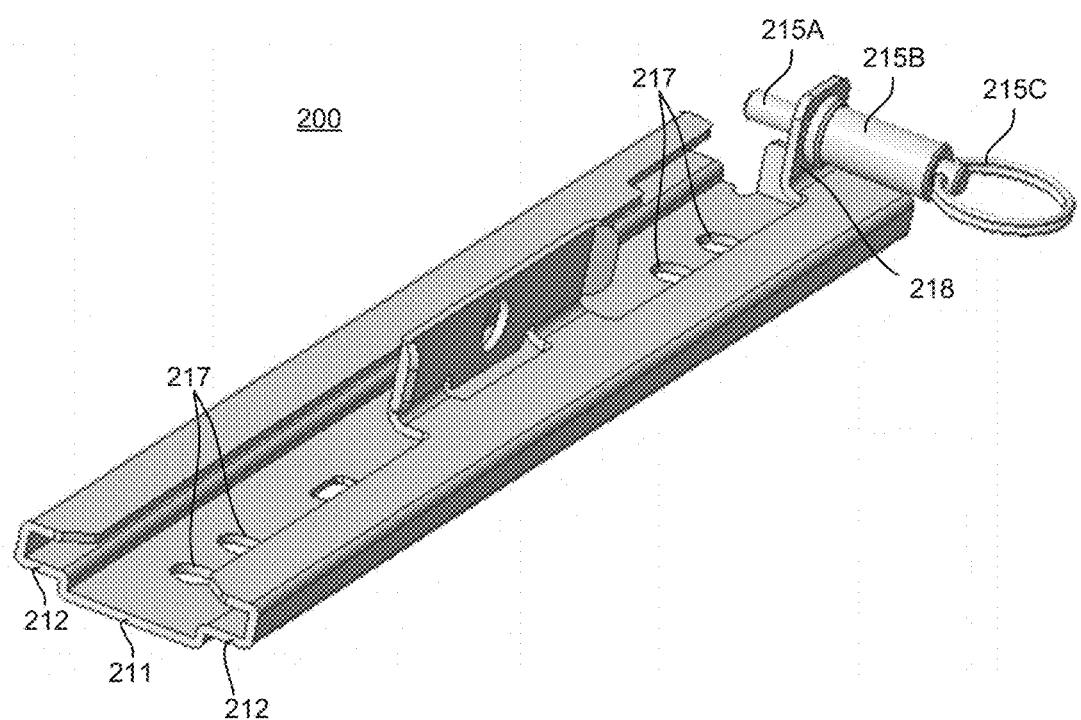
FIG. 4 illustrates a perspective view of an example device brace.
Figure 5:
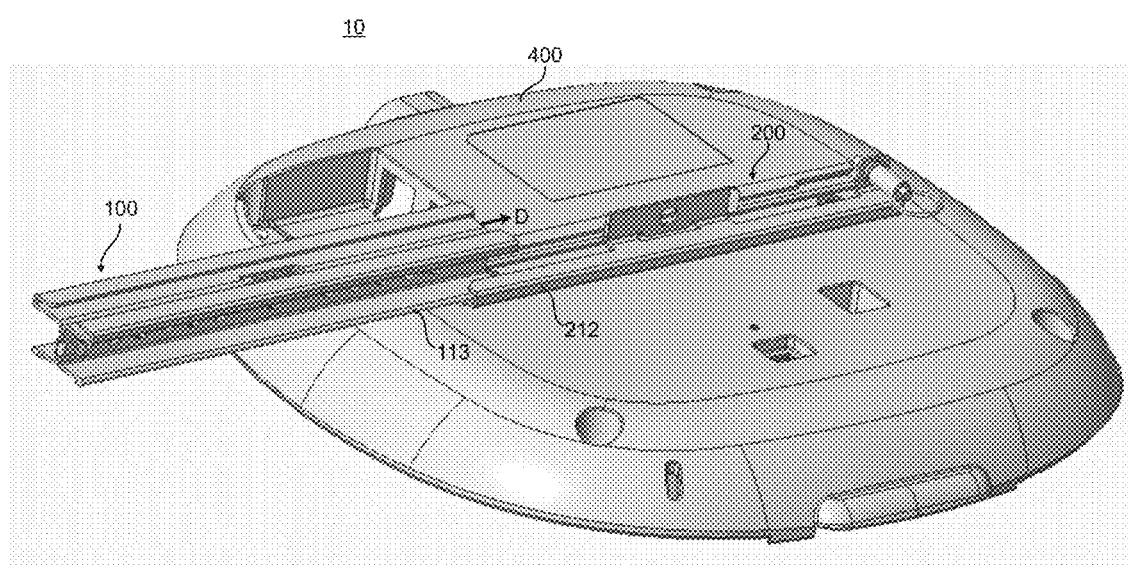
FIG. 5 illustrates a perspective view of the example device brace being attached to the bracket assembly.

The device brace 200 includes a bottom wall 211 and two grooves 212 connected to the bottom wall 211 (see FIGS. 2 & 4). The device brace 200 also includes a retention pin 215 (see FIGS. 2 & 4).

Each groove 212 is a structure that forms a slot or channel running along a longitudinal dimension of the device brace 200 (see FIGS. 2 & 4). Specifically, the groove 212 includes a bottom groove wall that extends horizontally from the bottom wall 211, an intermediate groove wall that extends vertically upward from the bottom wall, and a top groove wall that extends horizontally from the intermediate wall back towards the other groove 212 (see FIGS. 2 & 4). The grooves 212 are sized and shaped so as to receive the bottom flanges 113 of the brackets 110 (see FIGS. 2, 4, & 5). More specifically, the bottom flanges 113 slide into the grooves 212 as the bracket assembly 100 and the device brace 200 move longitudinally relative to one another (such longitudinal movement is indicated by the arrow D in FIG. 5, which is intended to show movement of the bracket assembly 100 relative to the device brace 200 as the device brace is slid onto the bottom flanges 113).

In some examples, the grooves 212 may be slightly raised relative to the bottom wall 211, as illustrated in FIGS. 2 and 4. Specifically, there may be a small vertical portion on each side of the bottom wall 211 connecting the bottom wall 211 to the groove 212. This may provide clearance for the heads of fasteners, such as screws, that may be used to fasten the device brace 200 to the AP 400 via holes 217. In other examples (not illustrated), the bottom groove walls of the grooves 212 may be flush with the bottom wall 211 (i.e., a portion of the bottom wall 211 may form the bottom groove wall). In some examples, the device braces 200 may include a stop 214 that is to contact the bracket assembly 100 to stop the device brace 200 from being slid past the installation position when sliding along the bottom flanges 113 (See FIG. 1A).

The grooves 212 are arranged such that, when they engage the flanges 113, the grooves 212 secure the brackets 110 together (see FIGS. 1 & 2). This means that the grooves 212 constrain translational motion of the first and second brackets 110A, 110B relative to one another along their horizontal lateral axes. The grooves 212 may also constrain rotation of the brackets 110 around their longitudinal axis.

The retention pin 215 can be tool-lessly actuated to engage the retention hole 116, which may be included in either or both of the brackets 110, when the device brace 200 has been slid along the bracket assembly 110 into an installed position (See FIG. 1A). The retention pin 215, when so engaged with the retention hole 116, prevents the device brace 200 from moving longitudinally out of the installed position (See FIG. 1A). Thus, the retention pin 215 secures the device brace 200 to the bracket assembly 100.

For example, the retention pin 215 may be a spring-loaded pin, which can be easily actuated without needing any tool. For example, the retention pin 215 may include a pin 215A, a spring cylinder 215B that houses a spring that biases the pin 215 towards where the retention hole 116 would be when the device brace 200 is in the installed position, and a ring 215C connected to the pin 215A such that a person my pull the pin 215A by pulling the ring 215C (See FIG. 4). The retention pin 215 may be connected to one of the grooves 212 by a vertical support 218.

2.3 Installation of the Mounting System 10

The mounting system 10 may be installed by first tool-lessly attaching the bracket assembly 100 to the ceiling rail 300, and then by tool-lessly attaching the device brace 200 (with the AP 400 already attached thereto) to the bracket assembly 100.

The bracket assembly 100 may be attached to the ceiling rail 300 by sliding each of the brackets 110 onto opposite flanges 301 of the rail 300, with the brackets 110 arranged back-to-back (i.e., with their vertical walls 111 touching). More specifically, sliding the bracket 110 onto the flange 301 means sliding the groove 112 laterally onto the flange 301. Sliding the groove 112 laterally onto the flange 301 may include moving the bracket 110 laterally relative to the rail 300 such that the flange 301 slides into the groove 112. The arrows A and B in FIG. 3B illustrate how the brackets 110 may be moved laterally relative to the rail 300, thereby causing the flanges 301 to slide into the grooves 112.

Figure 3C:
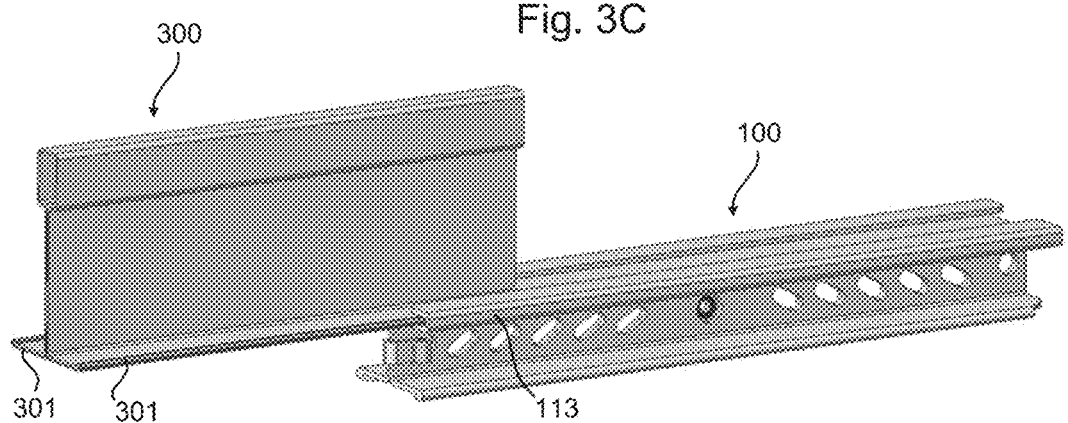
FIG. 3C illustrates a perspective view of an example bracket assembly attached to a ceiling rail.

As illustrated in FIG. 3B, when the brackets 110 are first attached to the rail 300, they are not yet held together by the retention clip 115. After the brackets 110 are both individually attached to the rail 300, the brackets 110 may be slid longitudinally relative to one another, while their grooves 112 maintain engagement with the flanges 301, until the retention clip 115 engages the second bracket 110B. The arrow C in FIG. 3B illustrates an example of such longitudinal sliding of the brackets 110 relative one another. FIGS. 3A and 3C illustrate the brackets 110 in a state in which the retention clip 115 is engaging the second bracket 110B.

Once the retention clip 115 engages the second bracket 110B, it holds the brackets 110 together, meaning it prevents the brackets 110 from moving laterally away from one another. Because the brackets 110 would need to move laterally away from one another to disengage from the rail 300, by holding the brackets 110 together, the retention clip 115 also ensures that the brackets 110 do not disengage from the rail 300. FIG. 3C illustrates the brackets after they are attached to the rail 300 and secured together by the retention clip (in practice, the rail 300 would extend the full length of the brackets 110, but in FIG. 3C a portion of it has been omitted to make portions of the bracket assembly 100 visible).

Although the retention clip 115 helps prevent the brackets 110 from disengaging from the rail 300, it may be designed to do so temporarily while the installer focuses on installing the device brace 200. For example, the retention clip 115 might be able to secure the brackets 110 together against their own weight, but might not be rated to secure the brackets 110 together under the weight of the AP 400 or under other anticipated conditions. Thus, the brackets 110 may be more securely held together by the device brace 200, as described below.

Next, the device brace 200, with the AP 400 already attached thereto, is attached to the bracket assembly 100 by positioning the device brace at an end of the bracket assembly 100 (e.g., the end opposite from the retention clip 115) with the bottom flanges 113 aligned with the grooves 212, and sliding the device brace 200 longitudinally onto the bracket assembly 100. More specifically, sliding the device brace 200 onto bracket assembly 100 means sliding the grooves 212 longitudinally onto the bottom flanges 113. Sliding the grooves 212 longitudinally onto the bottom flanges 113 may include moving the device brace 200 longitudinally relative to the bracket assembly 100 such that the bottom flanges 113 slide into the grooves 212. The arrow D in FIG. 3B illustrate how the device brace 200 may be moved longitudinally relative to the bracket assembly 100, thereby causing the bottom flanges 113 to slide into the grooves 212. Note that the arrow D is intended to illustrate the relative motion of the device brace 200 and the bracket assembly 100, and that in practice either the device brace 200 or the bracket assembly 100 could be moved while the other is held still, or both could be moved together.

The device brace 200 may continue to be slid longitudinally relative to the bracket assembly 100 until it reaches its installed position. The installed position may be a position at which the retention pin 215 is located so as to engage with the retention hole 116. In some examples, the stop 214 may prevent the device brace 200 from being slid past the installed position. This may make the installation process easier, as the person will know that the device brace 200 is at the installed position when it cannot slide any further, and thus will not have to attempt to determine by inspection if the device brace 200 is in the installed position.

The user may actuate the retention pin 215 while sliding the device brace 200 onto the bracket assembly 100 so that the pin 215 is retracted, and then may cause the retention pin 215 to extend into and engage the retention hole 116 once the device brace 200 is in the installed position. For example, if the retention pin 215 is a spring loaded pin with a ring 215C, as in the example illustrated in FIGS. 1-5, then the user may pull the ring 215C while sliding the device brace 200 onto the bracket assembly 100 and then release the ring 215C when the device brace 200 reaches the installed position, whereupon the spring will cause the pin 215A to engage the retention hole 116.

FIGS. 1-2 illustrate the mounting system 10 in an installed state, with the device brace 200 in the installed position relative to the bracket assembly 100. In FIGS. 1A and 1B, the ceiling rail 300 is omitted to avoid obscuring elements of the mounting system 10. In FIG. 2, the location of the flanges 301 of the ceiling rail 300 are indicated by dashed lines.

In the installed state, the flanges 301 of the rail 300 are engaged by the grooves 112 of the brackets 110, the bottom flanges 113 of the brackets 110 are engaged by the grooves 212 of the device brace 200, and the device brace 200 is attached to the AP 400. Thus, the flanges 301 vertically support the bracket assembly 100 which vertically supports the device brace 200 which vertically supports the AP 400.

In addition, in the installed state, the device brace 200 secures the bracket assembly 100 to the rail 300 without any threaded fasteners connecting the brackets 110 to the rail 300, to each other, or to the device brace 200. Specifically, the grooves 212 of the device brace 200 securely prevent the brackets 110 from moving apart from one another, thus preventing the brackets 110 from disengaging from the rail 300. Thus, the addition of the device brace 200 supplements the retention clip 115 to securely hold the brackets 110 together even under the weight of the AP 400.

As noted above, in some circumstances it may be desirable for the AP 400 to be attached to the device brace 200 prior to installing the mounting system 10 (i.e., prior to climbing the ladder to attach the bracket assembly 100 to the rail 300). For example, the device brace 200 may be attached to the AP 400 at the factory during manufacture. As another example, the device brace 200 may be attached to the AP 400 by the person installing the mounting system 10, but this may be done before climbing the ladder to attach the mounting system 10 to the rail 300. The AP 400 may be attached to the device brace 200 by any means, such as using screws or other threaded fasteners via the holes 217.

In examples in which the attachment of the device brace 200 to the AP 400 is completely separated from the installation of the mounting system 10 to the rail 300 (such as when the device brace 200 is factory installed), the attaching of the device brace 200 to the AP 400 dearly does not increase the complexity or difficulty of the mounting process at all, since it is not part of that process. Thus, the fact that fasteners are used to attach the device brace 200 to the AP 400 does not affect the complexity or difficulty of the mounting process at all in these examples.

In examples in which the person installing the mounting system 10 is the one who attaches the device brace 200 to the AP 400, this increases the complexity and difficulty of the mounting process, but only very slightly. Because the person can attach the device brace 200 to the AP 400 before they climb the ladder to attach the mounting system 10 to the rail 300, the difficulty of using the fasteners is greatly mitigated. Specifically, using tools and tightening fasteners while on the ladder, sometimes with just one hand available, can be particularly difficult, time consuming, and/or unsafe. However, using tools or tightening fasteners while off the ladder is not as difficult, time consuming, or unsafe.

Thus, the example mounting system 10 greatly improves the ease of its installation by enabling at least all of the steps in the installation process that need to be performed while on a ladder to be done tool-lessly and without having to rely on threaded fasteners. Moreover, the example mounting system 10 greatly improves the ease of its installation by enabling the bracket assembly 100 to be installed not only tool-lessly, but also using just one hand.

3. Example Methods

Figure 6:
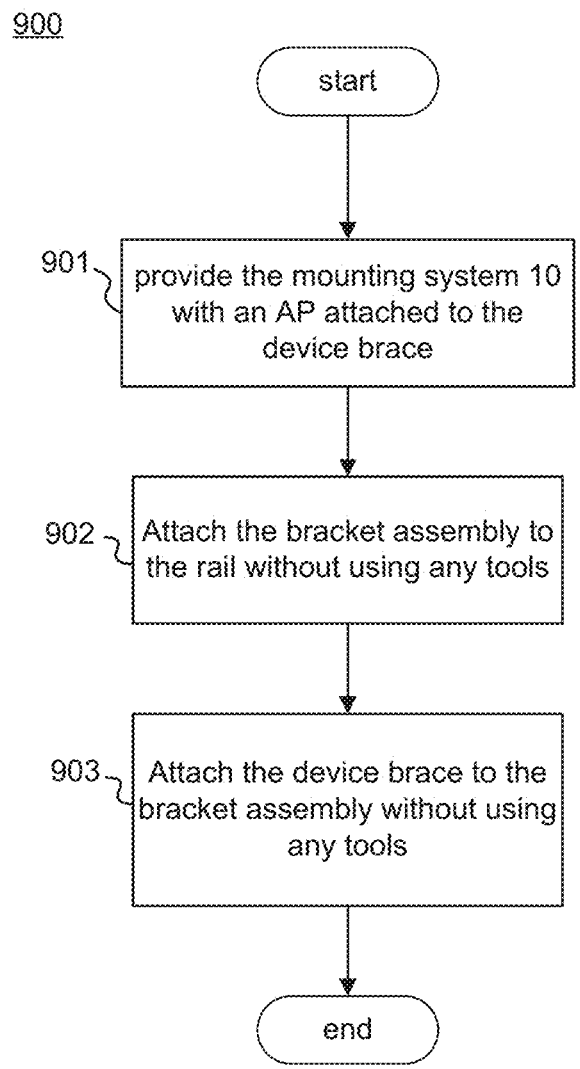
FIG. 6 illustrates a process flow chart for an example method.

FIGS. 6 and 7 illustrate example methods of attaching an electronic device (such as an AP) to a structure (such as a ceiling rail) using example mounting systems disclosed herein.

FIG. 6 illustrates a process 900. The process 900 begins at block 901, at which one of the example mounting systems disclosed herein, such as he mounting system 10, is provided. The mounting system will have a bracket assembly and a device brace, as described above. In addition, the electronic device (e.g., the AP) will be attached to the device brace prior to block 901 (e.g., it may be factory installed, or may be attached prior to starting the process 900).

At block 902, the bracket assembly is attached to the rail without using any tools. This may include sliding the grooves of the first and second brackets onto flanges of the rail and sliding the second bracket into engagement with the retention clip such that the retention clip holds the first and second brackets together on the rail. Sliding the second bracket into engagement with the retention clip may include, while the first and second brackets abut one another and while the grooves of the first and second brackets engage the flanges of the rail, moving the first and second brackets longitudinally relative to one another until the second bracket is received into a slot defined by the retention clip. In addition, attaching the bracket assembly to the rail may be done without using any threaded fasteners to fix the first and second brackets to each other or to the rail.

At block 903, the device brace is attached to the bracket assembly without using any tools. This may include sliding the grooves of the device brace onto the bottom flanges of the first and second brackets such that the bracket assembly vertically supports the device brace. In addition, attaching the device brace to the bracket assembly may include, as the grooves of the device brace are sliding onto the bottom flanges, retracting a retention pin until it aligns with a retention hole in the bracket assembly and then extending the retention pin into the retention hole. In addition, attaching the device brace to the bracket assembly may be done without using any threaded fasteners to fix the device brace to the bracket assembly.

FIG. 7 illustrates a process 905. The process 905 begins at block 906. At block 906, a first bracket and a second bracket are tool-lessly attached to a rail. This step may include various actions, which are illustrated in FIG. 7 as block 906*a*-906*c*. In particular, the first bracket and the second bracket may be tool-lessly attached to a rail by: sliding a groove of the first bracket onto a flange of the rail (block 906*a*), sliding a groove of the second bracket onto another flange of the rail such that the first and second brackets abut one another (block 906*b*), and moving the first and second brackets longitudinally relative to one another, while they abut one another and continue to engage the rail, until the second bracket is engaged by a retention clip of the first bracket such that the first and second brackets are held together by the retention clip (block 906*c*).

At block 906, a device brace, which is attached to an electronic device, is tool-lessly attached to the bracket assembly by sliding grooves of the device brace onto flanges of the first and second brackets such that the first and second brackets vertically support the device brace. This may include, as the grooves of the device brace are sliding onto the flanges of the first and second brackets, retracting a retention pin until it aligns with a retention hole in one of the first and second brackets and then extending the retention pin into the retention hole.

4. List of Reference Numerals

| | | | |
|---|---|---|---|
| 10 | Mounting system | | |
| | 100 | Bracket assembly | |
| | | 110 | Brackets (first bracket 110A, second bracket 110B) |
| | | | 111     vertical wall |
| | | | 112     groove |
| | | | 113     bottom flange |
| | | | 114     top flange |
| | | | 115     retention clip |
| | | |          115A    first portion |
| | | |          115B    second portion |
| | | |          115C    third portion |
| | | |          115D    fourth portion |
| | | | 116     retention hole |
| | 200 | Device brace | |
| | | 211 | bottom wall |
| | | 212 | grooves |
| | | 215 | retention pin |
| | | | 215A     pin |
| | | | 215B     spring cylinder |
| | | | 215C     ring |
| | | 217 | fastener holes |
| | | 218 | vertical support |
| 300 | Ceiling rail | | |
| | 301 | flanges | |
| 400 | AP | | |

5. Definitions

Groove: As used herein, "groove" refers to a structure that defines a slot or channel, where the slot or channel is longer than it is deep or wide. A groove will have at least a bottom groove wall and a top groove wall opposite the bottom groove wall, with the bottom and top groove walls being connected by an intermediate portion, with the slot or channel corresponding to the volume between the bottom and top groove walls. The walls of the groove do not necessarily have to be un-broken; for example, they could include lightening holes or the like. It is noted that "groove" can sometimes be used in everyday usage to refer to the empty space defined by a structure rather than referring to the structure itself, in which case "groove" is a sort of synonym for slot or channel; however, as used herein, "groove" always refers to the structure that defines the slot or channel, and not to the empty space that is the slot or channel.

Receive: As used herein, for a first structure that defines a slot, channel, or other opening (such as a groove) to "receive" a second structure (such as a flange), means that the second structure is inserted into the slot, channel, or other opening of the first structure.

Slide onto: As used herein, a groove sliding onto a flange means that the groove and the flange are moved relative to one another such that the flange enters into (i.e., is received into) the groove. The motion implied here is a relative motion between the groove and the flange, and thus does not specify which one (or both) of the groove and the flange are moving relative to some external reference frame. In other words, saying that "the groove slides on the flange" could include: the groove moving while the flange remains still relative to an external reference frame, the flange moving while the groove remains still relative to the external reference frame, and both the flange and groove moving relative to the external reference frame. Because the motion is relative, saying that the "groove slides onto the flange" is the equivalent of saying that the "flange slides into the groove".

Engage: As used herein, a groove engages, is engaging, or is engaged by or with a flange (or vice-versa) when the flange is at least partially inside the slot or channel defined by the groove—in other words, the flange is between the bottom and top groove walls of the groove. As used herein, the second bracket engages, is engaging, or is engaged by or with the retention clip (or vice-versa) when the vertical wall of the second bracket is at least partially within the slot defined by the retention clip—in other words, the vertical wall of the second bracket is located between the retention clip and the vertical wall of the first bracket. As used herein, the retention pin engages, is engaging, or is engaged by or with the retention hole when the pin extends into the retention hole.

Provide: As used herein, to "provide" an item means to have possession of and/or control over the item. This may include, for example, forming (or assembling) some or all of the item from its constituent materials and/or, obtaining possession of and/or control over an already-formed item.

Approximately. As used herein, terms of approximation such as approximately, roughly, about, substantially, etc., when used in relation to a direction or orientation, mean within ±10° of the specified direction or orientation. When such terms of approximation are used in relation to quantifiable physical qualities or relations such as distance, length, mass, conductivity, etc., they mean within ±10% of the specified quantity.

A number Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. A mounting system for attaching an electronic device to a rail, comprising:
   a bracket assembly comprising a first bracket and a second bracket that are separate from one another, each including a bottom flange and a top flange that forms a groove, the first bracket including a retention clip; and
   a device brace that is attachable to the electronic device and that includes two grooves,
   wherein the mounting system is tool-lessly attachable to the rail by:
      sliding the grooves of the first and second brackets onto flanges of the rail,
      sliding the second bracket into engagement with the retention clip such that the retention clip holds the first and second brackets together on the rail, and
      sliding the grooves of the device brace onto the bottom flanges of the first and second brackets such that the bracket assembly supports the device brace.

2. The mounting system of claim 1,
   wherein the device brace includes a retention pin that is capable of tool-less actuation, and that is configured to extend into a retention hole in the bracket assembly when the device brace is engaged with the bracket assembly and thereby prevent the device brace from sliding longitudinally relative to the bracket assembly.

3. The mounting system of claim 2,
   wherein the retention pin is a spring loaded pin that is spring biased towards extending into the retention hole.

4. The mounting system of claim 1,
   wherein the device brace, when engaging the bracket assembly, prevents the bracket assembly from disengaged from the rail.

5. The mounting system of claim 1,
   wherein the mounting system is tool-lessly attachable to the rail without any threaded fasteners fixing the first and second brackets to each other, to the rail, or to the device brace.

6. The mounting system of claim 1,
   wherein the retention clip and a wall of the first bracket define a slot therebetween that receives a wall of the second bracket as the retention clip engages the second bracket, and
   the retention clip is configured to passively guide the wall of the second bracket into the slot as the second bracket slides relative to the first bracket along a longitudinal axis of the second bracket.

7. The mounting system of claim 1,
   wherein each of the first and second brackets includes a vertical wall, the bottom flange extending horizontally from the vertical wall, and the top flange extending horizontally from the vertical wall, and
   the retention clip extends from the vertical wall of the first bracket and forms a slot that is configured to receive the vertical wall of the second bracket when the vertical walls of the first and second brackets abut one another and are moved longitudinally relative to one another.

8. The mounting system of claim 7,
   wherein the respective grooves of the first and second brackets are each configured to, when aligned with and moved laterally relative to one of the flanges of the rail, receive the flange of the rail such that the flange of the rail vertically supports the respective top flange.

9. The mounting system of claim 1,
   wherein the grooves of the device brace are configured to receive the bottom flanges of the first and second brackets, respectively, when the bracket assembly and device brace are moved longitudinally relative to one another, such that:
      the bottom flanges of the first and second brackets vertically support the device brace, and
      the device brace constrains lateral movement of the first and second brackets relative to one another.

10. The mounting system of claim 1,
    wherein each of the first and second brackets includes a vertical wall, the bottom flange extending horizontally from the vertical wall, and the top flange extending horizontally from the vertical wall,
    the respective grooves of the first and second brackets are each configured to, when aligned with and moved laterally relative to one of the flanges of the rail, receive the flange of the rail such that the flange of the rail vertically supports the respective top flange,
    the retention clip extends from the vertical wall of the first bracket and forms a slot that is configured to receive the vertical wall of the second bracket when the vertical walls of the first and second brackets abut one another and are moved longitudinally relative to one another, and
    the grooves of the device brace are configured to receive the bottom flanges of the first and second brackets, respectively, when the bracket assembly and device brace are moved longitudinally relative to one another, such that:
       the bottom flanges of the first and second brackets vertically support the device brace, and
       the device brace constrains lateral movement of the first and second brackets relative to one another.

11. A method, comprising:
    providing the mounting system of claim 1 with the device brace attached to the electronic device;
    attaching the bracket assembly to the rail without using tools; and
    attaching the device brace to the bracket assembly without using tools.

12. The method of claim 11,
wherein attaching the bracket assembly to the rail without using tools includes:
sliding the grooves of the first and second brackets onto flanges of the rail and
sliding the second bracket into engagement with the retention clip such that the retention clip holds the first and second brackets together on the rail.

13. The method of claim 12,
wherein sliding the second bracket into engagement with the retention clip includes, while the first and second brackets abut one another and while the grooves of the first and second brackets engage the flanges of the rail, moving the first and second brackets longitudinally relative to one another until the second bracket is received into a slot defined by the retention clip.

14. The method of claim 11,
wherein attaching the device brace to the bracket assembly without using tools includes sliding the grooves of the device brace onto the bottom flanges of the first and second brackets such that the bracket assembly vertically supports the device brace.

15. The method of claim 14,
wherein the attaching the device brace to the bracket assembly without using tools includes, as the grooves of the device brace are sliding onto the bottom flanges, retracting a retention pin until it aligns with a retention hole in the bracket assembly and then extending the retention pin into the retention hole.

16. A mounting system for attaching an electronic device to a rail, comprising:
a bracket assembly comprising a first bracket and a second bracket that are separate from one another, each including:
a vertical wall,
a bottom flange extending horizontally from the vertical wall, and
a top flange extending horizontally from the vertical wall and forming a groove that is configured to receive a flange of the rail, such that the flange of the rail vertically supports the top flange; and
a device brace that is attachable to the electronic device and that includes two grooves that are configured to receive the bottom flanges of the first and second brackets, respectively, such that the bottom flanges of the first and second brackets vertically support the device brace,
wherein, when the device brace engages the bracket assembly while the bracket assembly is engaging the rail, the device brace prevents the bracket assembly from disengaging from the rail without any threaded fasteners fastening the first and second brackets together, to the rail, or to the device brace.

17. The mounting system of claim 16, comprising:
a retention clip extending from the vertical wall of the first bracket and forming a slot that is configured to receive the vertical wall of the second bracket and hold the first and second brackets together when the device brace is not engaged with the bracket assembly.

18. A method, comprising:
providing the mounting system of claim 16 with the device brace attached to the electronic device;
attaching the bracket assembly to the rail without using tools; and
attaching the device brace to the bracket assembly without using tools.

19. A method, comprising
tool-lessly attaching a first bracket and a second bracket to a rail by
sliding a groove of the first bracket onto a flange of the rail,
sliding a groove of the second bracket onto another flange of the rail such that the first and second brackets abut one another, and
moving the first and second brackets longitudinally relative to one another, while they abut one another and continue to engage the rail, until the second bracket is engaged by a retention clip of the first bracket such that the first and second brackets are held together by the retention dip; and
tool-lessly attaching a device brace, which is attached to an electronic device, to the bracket assembly by sliding grooves of the device brace onto flanges of the first and second brackets such that the first and second brackets vertically support the device brace.

20. The method of claim 18, comprising:
as the grooves of the device brace are sliding onto the flanges of the first and second brackets, retracting a retention pin until it aligns with a retention hole in one of the first and second brackets and then extending the retention pin into the retention hole.

* * * * *